(12) United States Patent
Chen et al.

(10) Patent No.: US 10,324,505 B2
(45) Date of Patent: Jun. 18, 2019

(54) HEAT DISSIPATION ASSEMBLY AND ELECTRONIC DEVICE USING THE SAME

(71) Applicant: Quanta Computer Inc., Taoyuan (TW)

(72) Inventors: Chih-Chao Chen, Taoyuan (TW); Pei-Yu Chang, Taoyuan (TW); Chia-Hung Ma, Taoyuan (TW); Chih-Wei Jen, Taoyuan (TW)

(73) Assignee: Quanta Computer Inc., Taoyuan (TW)

( * ) Notice: Subject to any disclaimer, the term of this patent is extended or adjusted under 35 U.S.C. 154(b) by 17 days.

(21) Appl. No.: 15/486,719

(22) Filed: Apr. 13, 2017

(65) Prior Publication Data

US 2018/0192546 A1 Jul. 5, 2018

(30) Foreign Application Priority Data

Dec. 29, 2016 (TW) .............................. 105143980 A

(51) Int. Cl.
| | |
|---|---|
| *H05K 7/20* | (2006.01) |
| *G06F 1/20* | (2006.01) |
| *H01L 23/427* | (2006.01) |
| *F28D 15/02* | (2006.01) |
| *H01L 23/367* | (2006.01) |
| *H01L 23/40* | (2006.01) |

(52) U.S. Cl.
CPC ............ *G06F 1/20* (2013.01); *F28D 15/0275* (2013.01); *H01L 23/427* (2013.01); *H01L 23/3672* (2013.01); *H01L 23/4006* (2013.01)

(58) Field of Classification Search
CPC ............... H01L 23/427; H01L 23/4006; H01L 23/4093; H01L 2023/405; H01L 2023/4068; H01L 2023/4087; H01L 23/367; H01L 23/40; G06F 1/203; G06F 1/20; G06F 1/1684; F28D 15/0275; F28D 2021/0028; H05K 7/20

See application file for complete search history.

(56) References Cited

U.S. PATENT DOCUMENTS

| | | | | |
|---|---|---|---|---|
| 7,466,548 | B2 * | 12/2008 | Ishikawa ................. | G06F 1/203 |
| | | | | 165/104.33 |
| 8,804,336 | B2 * | 8/2014 | Lee ........................ | H01L 23/427 |
| | | | | 361/679.47 |
| 2004/0001316 | A1 * | 1/2004 | Kamikawa ............ | H01L 23/427 |
| | | | | 361/700 |

(Continued)

FOREIGN PATENT DOCUMENTS

| | | |
|---|---|---|
| TW | I296367 B | 5/2008 |
| TW | 201116199 A | 5/2011 |
| TW | I497260 B | 8/2015 |

*Primary Examiner* — James Wu
*Assistant Examiner* — Michael A Matey

(57) ABSTRACT

A heat dissipation assembly includes a pressing unit and a heat dissipation module. The pressing unit includes a pressing plate, a plurality of elastic cantilevers and contacting members. The pressing plate can be secured on a bottom plate so that a heat source can be sandwiched between the pressing plate and the bottom plate. The elastic cantilevers are respectively disposed on the pressing plate and protruded outwards from the pressing plate to be suspended in midair. The contacting members are respectively disposed on the elastic cantilevers for abutting the bottom plate. The heat dissipation module is fixedly connected to the pressing plate and a carrier member for thermally guiding the heat source.

8 Claims, 8 Drawing Sheets

(56) References Cited

U.S. PATENT DOCUMENTS

| | | | |
|---|---|---|---|
| 2008/0165501 A1* | 7/2008 | Stewart | H01L 23/4006 361/704 |
| 2011/0110040 A1* | 5/2011 | Liu | H01L 23/4006 361/696 |
| 2011/0228480 A1* | 9/2011 | Lo | G06F 1/20 361/704 |
| 2012/0293958 A1* | 11/2012 | Lee | H01L 23/427 361/696 |
| 2013/0077251 A1* | 3/2013 | Yang | G06F 1/20 361/709 |
| 2013/0135825 A1* | 5/2013 | Chen | H01L 23/4093 361/720 |
| 2013/0148299 A1* | 6/2013 | Honda | H01L 23/4006 361/700 |
| 2013/0194513 A1* | 8/2013 | Kitamura | H05K 5/02 348/836 |
| 2014/0002999 A1* | 1/2014 | Chen | H01L 23/4006 361/719 |
| 2014/0355182 A1* | 12/2014 | Wang | H05K 7/142 361/679.01 |

* cited by examiner

HEAT DISSIPATION ASSEMBLY AND ELECTRONIC DEVICE USING THE SAME

RELATED APPLICATIONS

This application claims priority to Taiwan Application Serial Number 105143980, filed Dec. 29, 2016, which is herein incorporated by reference.

BACKGROUND

Field of Disclosure

The present disclosure relates to a heat dissipation assembly, more particularly, the present disclosure relates to a heat dissipation assembly of an electronic device.

Description of Related Art

Since a working chip (i.e., a heat source) driven by a computer system will generate heat, the ambient temperature within the computer system may be increased, thereby reducing system stability, and may further lead to system failure. Therefore, by assembling a heat dissipation module to be in contact with the working chip, the thermal energy of the working chip can be conducted away through the heat dissipation module so as to control the ambient temperature within the computer system, and further maintain system stability.

However, when the heat dissipation module assembled in the computer system is slightly deviated from an expected location due to reasons such as different assembly tolerances and assembly force, a variable moment which cannot be offset by the heat dissipation module may therefore occur, thereby, not only decreasing the pressing force of the heat dissipation module to the working chip, but also affecting the contacting area of the heat dissipation module to the working chip, and further decreasing the heat dissipation efficiency of the heat dissipation module to the working chip.

SUMMARY

An aspect of the disclosure is to provide a heat dissipation assembly and an electronic device using the same, which can solve the problem mentioned above, that is, the aforementioned variable moment of the heat dissipation module assembled on the working chip can be reduced or offset so as to maintain a suitable and uniform pressing force on the working chip, thereby saving any cost caused from poor heat dissipation.

According to one embodiment, an electronic device includes a carrier member, a bottom plate, a heat source, a pressing unit and a heat dissipation module. The heat source is disposed on one surface of the bottom plate. The pressing unit includes a pressing plate, a plurality of elastic cantilevers and a plurality of contacting members. The pressing plate is secured on the bottom plate such that the heat source is sandwiched between the bottom plate and the pressing plate. The elastic cantilevers are respectively disposed on the pressing plate and protrude outwards from the pressing plate to be suspended in midair. The contacting members are respectively disposed on the elastic cantilevers, and directly abut against the surface of the bottom plate. The heat dissipation module is fixedly connected to the pressing plate and the carrier member, and thermally guides the heat source.

According to one embodiment, a heat dissipation assembly includes a pressing unit and a heat dissipation module. The pressing unit includes a pressing plate, a plurality of elastic cantilevers and contacting members. The pressing plate for being secured on a bottom plate so that a heat source can be sandwiched between the pressing plate and the bottom plate. The elastic cantilevers are respectively disposed on the pressing plate to protrude outwards from the pressing plate to be suspended in midair. The contacting members are respectively disposed on the elastic cantilevers for abutting the bottom plate. The heat dissipation module is fixedly connected to the pressing plate and a carrier member for thermally guiding the heat source.

In one or more embodiments of the present disclosure, each of the elastic cantilevers is provided with a major axis direction in which every two neighboring ones of the major axis directions are intersected with each other, and an intersection point of the two major axis directions overlaps the heat source.

In one or more embodiments of the present disclosure, each of the elastic cantilevers is provided with a major axis direction in which two of the major axis directions are coaxial, and extended over the heat source.

In one or more embodiments of the present disclosure, the heat dissipation module includes a heat pipe, a holding rack and a fin assembly. The heat pipe is fixedly connected to the pressing plate. The holding rack is fixedly connected to the carrier member. The fin assembly is received in the holding rack, and fixedly connected to the heat pipe. The elastic cantilevers are respectively connected to two opposite lateral sides of the pressing plate, and a route of the heat pipe extending to the fin assembly passes through one of the two opposite lateral sides of the pressing plate.

In one or more embodiments of the present disclosure, one of the contacting members includes a pillar, a rigid ball and a resilient member. The pillar is raised outwards from one of the elastic cantilevers. The rigid ball is disposed on one end of the pillar, and is in direct contact with the surface of the bottom plate. The resilient member abuts against the pillar and the rigid ball.

In one or more embodiments of the present disclosure, each of the contacting members includes a threaded bolt screwed on one of the elastic cantilevers, and one end surface of the threaded bolt is in direct contact with the surface of the bottom plate.

In one or more embodiments of the present disclosure, each of the contacting members includes a tension spring installed on one of the elastic cantilevers, and the tension spring is compressible and in direct contact with the surface of the bottom plate.

In one or more embodiments of the present disclosure, the pressing plate is provided with a plurality of sides and corners. Each of the sides is arranged between two neighboring ones of the corners. One of the elastic cantilevers is connected to one of the corners; or one of the elastic cantilevers is connected to a position between two neighboring ones of the corners.

In one or more embodiments of the present disclosure, the pressing plate is provided with a first main surface and a second main surface which are opposite to each other, the heat dissipation module is fixedly connected to the first main surface of the pressing plate, and the second main surface is facing towards the heat source. One of the elastic cantilevers is connected to the first main surface, and extends outwardly to be suspended in midair.

As what is disclosed above, comparing to the conventional arts, the solution provided by the present disclosure has advantages and beneficial effects. With the aforementioned solution, the technical improvement and practicability are provided and can be widely applied in the relative industries, wherein the solution provided by the present disclosure at least has the following advantages:

1. the aforementioned variable moment of the heat dissipation module assembled on the working chip due to assembly deviation can be dynamically offset according to the direction of the heat dissipation module is assembled, so as to maintain the heat dissipation efficiency of the heat dissipation module to the heat source;

2. In the elimination of the aforementioned variable moment for stress balance, the stress distribution on the bottom plate can be averaged so to avoid stress concentration; and 3. Even if the stress on the heat source is exceeded, the exceeded stress can still be buffered or absorbed partially.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

DESCRIPTION OF THE EMBODIMENTS

Figure 1:
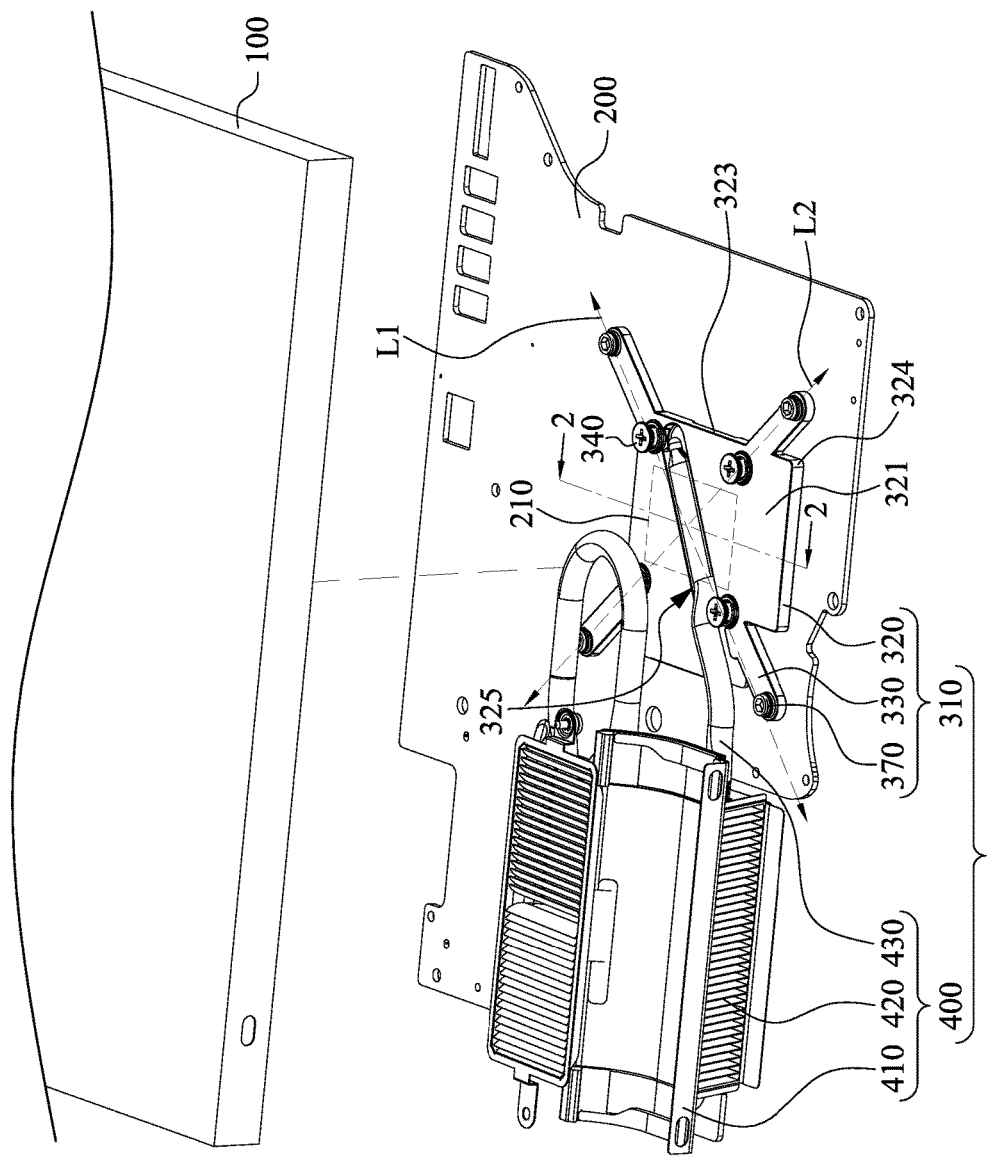
FIG. 1 is a perspective view of an electronic device according to one embodiment of the disclosure.

Reference will now be made in detail to the present embodiments of the disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the disclosure.

Figure 2:
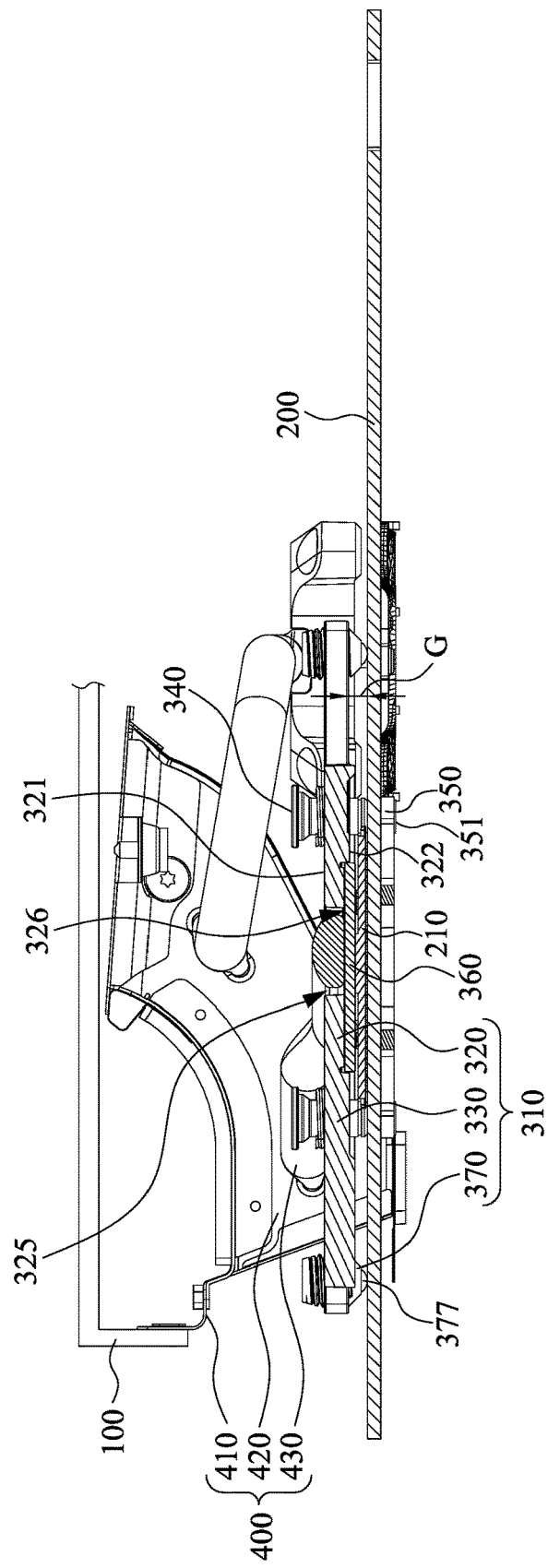
FIG. 2 is a cross sectional view of FIG. 1 taken along line 2-2.

Reference is now made to FIG. 1 and FIG. 2, in which FIG. 1 is a perspective view of an electronic device 10 according to one embodiment of the disclosure, FIG. 2 is a cross sectional view of FIG. 1 taken along line 2-2. As shown in FIG. 1, in the embodiment, the electronic device 10 includes a carrier member (e.g., an outer case 100), a bottom plate 200, at least one heat source 210 and a heat dissipation assembly 300. The heat dissipation assembly 300 includes a pressing unit 310 and a heat dissipation module 400. The heat source 210 is disposed on one surface of the bottom plate 200. The pressing unit 310 includes a pressing plate 320, a plurality of elastic cantilevers 330 and contacting members 370. The pressing plate 320 is secured on the bottom plate 200 so that the heat source 210 is sandwiched between the pressing plate 320 and the bottom plate 200. The elastic cantilevers 330 are respectively disposed on outer edges of the pressing plate 320 to horizontally protrude outwards from the pressing plate 320 to be suspended in midair. The contacting members 370 are respectively disposed on the elastic cantilevers 330, and collectively abut the bottom plate 200. The heat dissipation module 400 includes a holding rack 410, a fin assembly 420 and a heat pipe 430. The holding rack 410 is fixedly connected to the outer case 100. The fin assembly 420 is received in the holding rack 410, and fixedly connected to the heat pipe 430. The heat pipe 430 is fixedly connected to the pressing plate 320. It is noted, the contacting members 370 are not bonded to the bottom plate 200, and the surface of each of the contacting members 370 is in contact with the surface of the bottom plate 200 instead.

Figure 3:
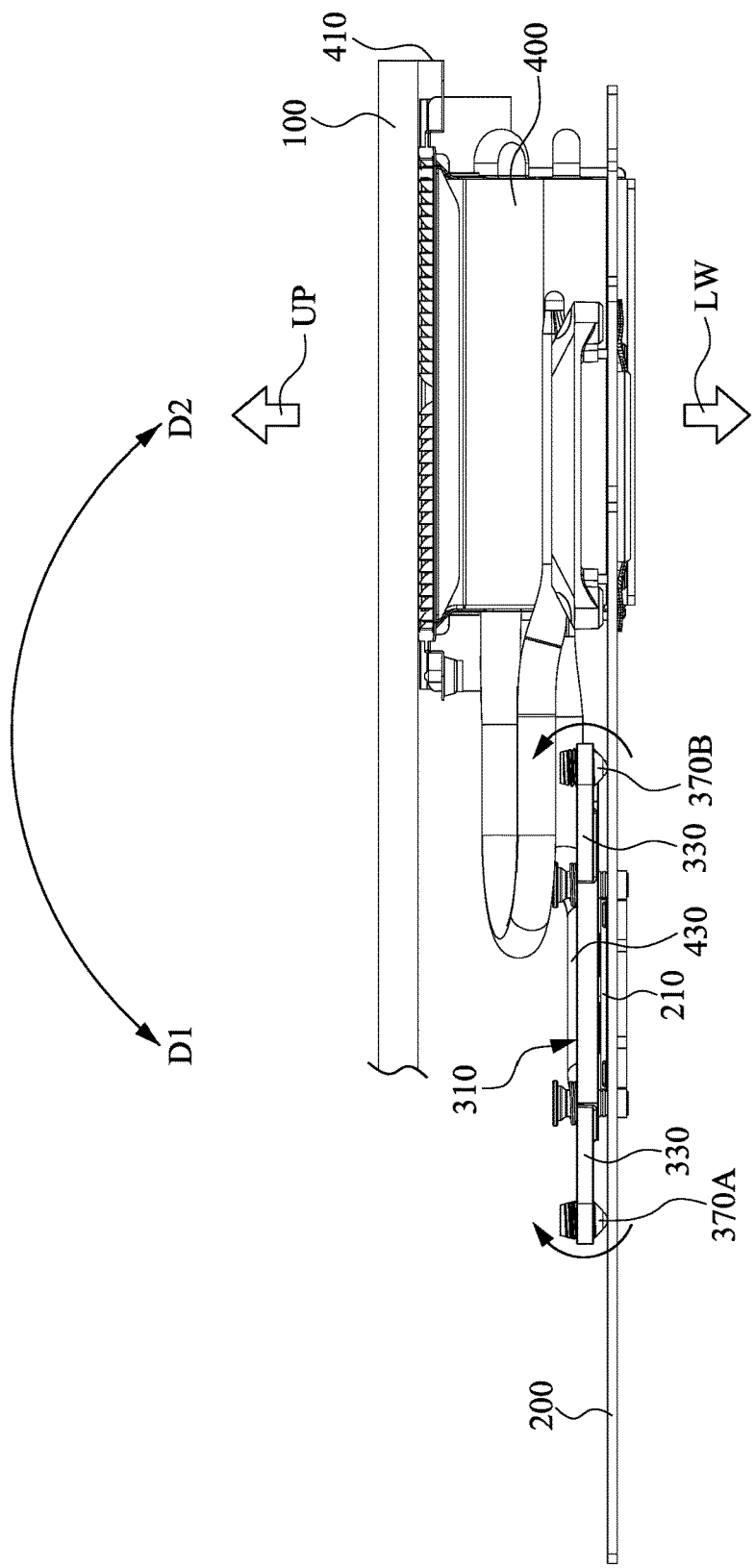
FIG. 3 is a schematic view of torque directions on the electronic device of FIG. 2.

FIG. 3 is a schematic view of torque directions on the electronic device 10 of FIG. 2. As shown in FIG. 3, when an assembler pulls the heat dissipation module 400 upwards in an upper direction UP for assembling the heat dissipation module 400 onto the outer case 100 (FIG. 2), although the heat pipe 430 will make the pressing unit 310 warped along the direction D1, however, since the contacting member 370A of one of the elastic cantilevers 330 which is furthest from the heat dissipation module 400 abuts the surface of the bottom plate 200, therefore, the bottom plate 200 provides a reaction force to the contacting member 370A, so as to absorb or offset a variable moment occurred by the pressing unit 310 to the heat source 210, thus, the contacting areas of the pressing unit 310 to the heat source 210 will not be reduced. On the contrary, when the assembler pushes the heat dissipation module 400 downwards in a lower direction LW for assembling the heat dissipation module 400 onto the outer case 100 (FIG. 2), although the heat pipe 430 will make the pressing unit 310 warped along the direction D2, however, since the contacting member 370B of one of the elastic cantilevers 330 which is closed to the heat dissipation module 400 abuts the surface of the bottom plate 200, therefore, the bottom plate 200 provides a reaction force to the contacting member 370B, so as to absorb or offset a variable moment occurred by the pressing unit 310 to the heat source 210, thus, the contacting areas of the pressing unit 310 to the heat source 210 will not be reduced as well.

Therefore, since the contacting members 370A and 370B of the pressing unit 310 in the embodiment can dynamically absorb or offset the aforementioned variable moment occurred by the pressing unit 310 to the heat source 210 according to the direction of the heat dissipation module is assembled, so as to maintain the heat dissipation efficiency of the heat dissipation module 400 to the heat source 210. However, the disclosure is not limited to assemble the heat dissipation module 400 onto the outer case 100 only, in other embodiment, the heat dissipation module 400 also can be assembled onto another carrier member such as a back case, a reinforcement frame or alike.

Specifically, as shown in FIG. 2, the heat source 210 is soldered on a circuit board, and the heat source 210 is for example, a graphic processing unit or a central processing unit. A heat-spreading plate 360 is further sandwiched between the heat source 210 and the pressing unit 310 for homogenizing and conducting the heat energy of the heat source 210 to the pressing unit 310. The pressing unit 310 further includes a plurality of spring fasteners 340 and a reinforcement unit 350. The spring fasteners 340 are symmetrically disposed on the pressing plate 320, and collectively securely fastened on the bottom plate 200. The reinforcement unit 350 is disposed on another surface of the bottom plate 200 opposite to the pressing plate 320, and is securely fastened on the spring fasteners 340 through threaded bolts 351 respectively so as to intensify the force for pressing the heat source 210 between the bottom plate 200 and the pressing plate 320 (or the heat-spreading plate 360). The bottom plate 200 for example can be a circuit board. Furthermore, the pressing plate 320 is formed with an accommodation recess 325 and a through hole 326. The through hole 326 is formed on a bottom portion of the accommodation recess 325 such that the heat-spreading plate 360 can be exposed outwards from the accommodation recess 325 through the through hole 326. The heat pipe 430 is received in the accommodation recess 325 and is welded on the pressing plate 320, and the heat pipe 430 is in direct contact with the heat-spreading plate 360 through the through hole 326 for thermally connecting to the heat source 210.

As shown in FIG. 1, in the embodiment, the elastic cantilevers 330 is four in number, and are approximately equidistantly located on the outer edges of the pressing plate 320. On the other word, the elastic cantilevers 330 are separately arranged on the outer edges of the pressing plate 320 so that the elastic cantilevers 330 collectively surround the pressing plate 320. Also, the elastic cantilevers 330 are elongated, respectively, and the elastic cantilevers 330 respectively have major axis directions L1, L2, that is, a part of the elastic cantilevers 330 extends outwards from the outer edges of the pressing plate 320 along the major axis direction L1, and another part of the elastic cantilevers 330 extends outwards from the outer edges of the pressing plate 320 along the major axis direction L2. Every two non-neighboring elastic cantilevers 330 are diametrically opposed to each other so that the two non-neighboring elastic cantilevers 330 are coaxial with the major axis direction L1 or L2, however, the disclosure is not limited thereto.

Additionally, in order to effectively absorb or offset the aforementioned variable moment with the reaction forces generated by the contacting members 370, in the embodiment, the heat source 210 is substantially located at a central position of a region surrounded by the elastic cantilevers 330, that is, every two neighboring major axis directions L1, L2 of the two elastic cantilevers 330 intersect each other, and an orthographic projection of the intersection point of the two major axis directions L1, L2 overlaps the heat source 210.

Concretely, in the embodiment, the pressing plate 320 is generally rectangular or nearly rectangular, and the pressing plate 320 is provided with a first main surface 321, a second main surface 322, a plurality of lateral sides 323 and a plurality of corners 324. The first main surface 321 and the second main surface 322 are oppositely arranged to each other. The lateral sides 323 respectively adjoin and surround the first main surface 321 and the second main surface 322. The heat dissipation module 400 is fixedly connected to the first main surface 321 of the pressing plate 320, and the second main surface 322 faces towards the heat source 210. Each of the lateral sides is arranged between two neighboring ones of the corners 324. One of the elastic cantilevers 330 is connected to one of the corners 324 so that the elastic cantilever 330 horizontally extends outwards from the corner 324 of the pressing plate 320. Alternatively, one of the elastic cantilevers 330 is connected to a position of one lateral side between two neighboring corners 324 of the pressing plate 320 so that the elastic cantilever 330 horizontally extends outwards from the position between the neighboring corners 324 of the pressing plate 320. However, the disclosure is not limited thereto, in another embodiment, the positions of the elastic cantilevers 330 may be arbitrarily altered in accordance with the limitation of the arrangement space on the bottom plate 200. For example, all of the elastic cantilevers also can horizontally extend outwards from the corners or lateral sides of the pressing plate 320, respectively. Even all or a part of the elastic cantilevers can horizontally extend outwards from the first main surface of the pressing plate, rather than from the corners or lateral sides of the pressing plate.

In addition, since the pressing unit 310 is an equally-thick plate structure, the thickness of each of the elastic cantilevers 330 is same as the thickness of the pressing plate 320, and the pressing plate 320 and the elastic cantilevers 330 are coplanar. On the other word, because each of the elastic cantilevers 330 protrudes outwards from the pressing plate 320 to be suspended in midair, a gap G is therefore defined between the bottom plate 200 and the elastic cantilever 330 so that each of the contacting members 370 directly contacts the corresponding elastic cantilever 330 and the bottom plate 200 in the gap G. Also, the pressing plate 320 and the elastic cantilevers 330 are integrally formed collectively. However, the disclosure is not limited thereto, in another embodiment, the elastic cantilevers 330 also can be detachably connected to the pressing plate.

Figure 4:
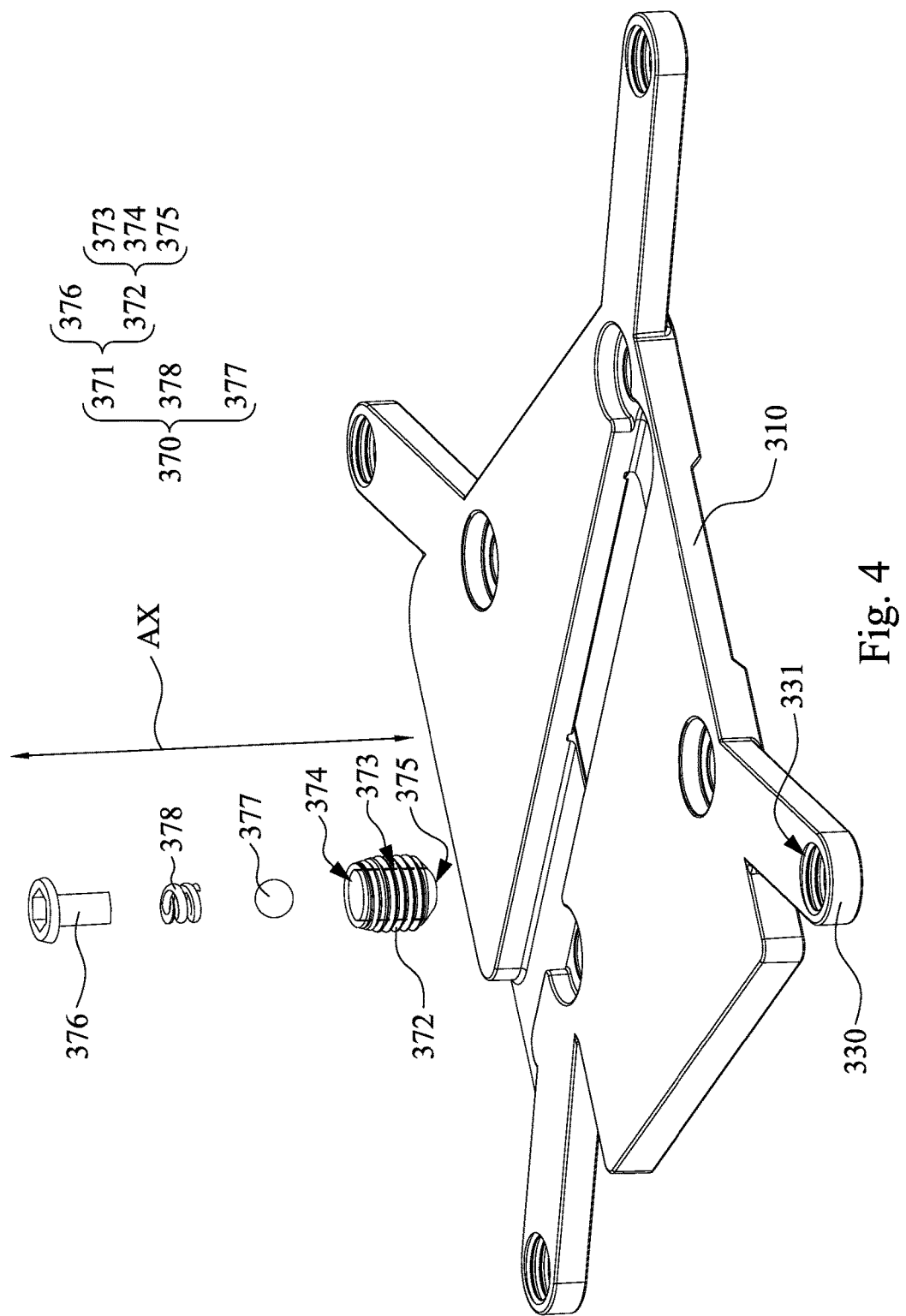
FIG. 4 is a disassembled view of a contacting member of FIG. 2 cooperated with the pressing unit.

FIG. 4 is a disassembled view of a contacting member 370 of FIG. 2 cooperated with each of the pressing units 310. As shown in FIG. 2 and FIG. 4, in the embodiment, each of the contacting members 370 includes a pillar 371, a rigid ball 377 and a resilient member 378. The pillar 371 is raised outwards from one of the elastic cantilevers 330. The rigid ball 377 is disposed on one end of the pillar 371, and is in direct contact with the surface of the bottom plate 200. The resilient member 378 abuts against the pillar 371 and the rigid ball 377. More specifically, the pillar 371 includes a threaded bolt 372 and a nut cover 376. The threaded bolt 372 is fastened in a tapped hole 331 of one of the elastic cantilevers 330, and extends towards the bottom plate 200. The threaded bolt 372 is provided with a penetrating passage 373, a large opening 374 and a small opening 375. The penetrating passage 373 is formed in the threaded bolt 372, and a major axel direction AX of the threaded bolt 372 and a major axel direction AX of the penetrating passage 373 are coaxial. The large opening 374 and the small opening 375 are respectively formed on two opposite ends of the threaded bolt 372, and the large opening 374 and the small opening 375 are collectively in communication with the penetrating passage 373. The rigid ball 377 is placed into the penetrating passage 373 of the threaded bolt 372 via the large opening 374 and the rigid ball 377 is stuck on the small opening 375 so that the rigid ball 377 is partially exposed outwards from the small opening 375 for point-contacting the surface of the bottom plate 200. The nut cover 376 inserts into the penetrating passage 373 for covering the large opening 374. The resilient member 378 for example can be a tension spring, and is disposed in the penetrating passage 373. Two opposite ends of the resilient member 378 respectively abut the rigid ball 377 and the nut cover 376. The resilient member 378 not only exerts a pressure force to abut against the bottom plate 200 through the rigid ball 377, but also buffers the reaction force which is feed to the rigid ball 377 from the bottom plate 200.

Figure 5:
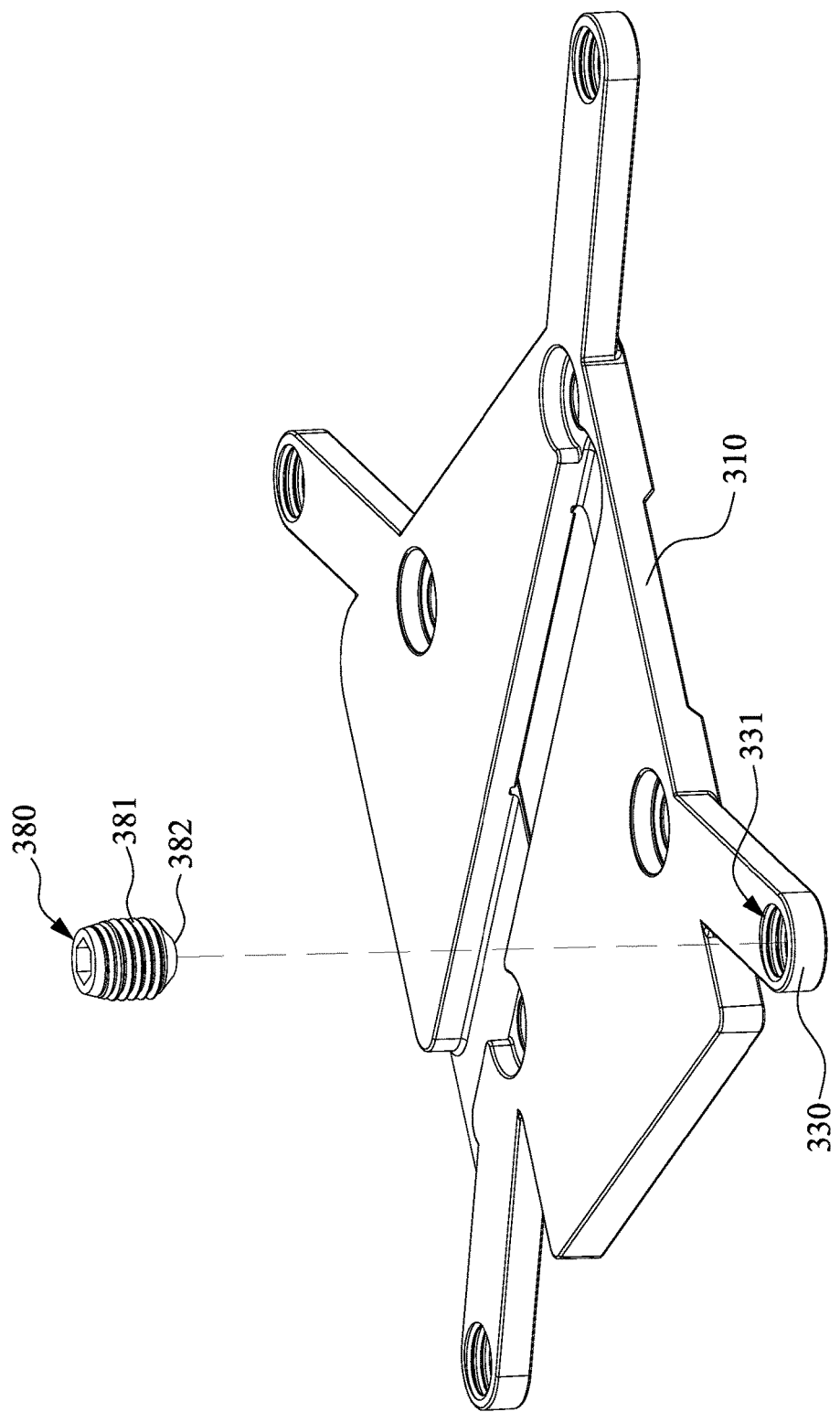
FIG. 5 is a disassembled view of a contacting member cooperated with the pressing unit according to one embodiment of the disclosure.

FIG. 5 is a disassembled view of a contacting member 380 cooperated with the pressing unit 310 according to one embodiment of the disclosure. As shown in FIG. 2 and FIG. 5, in the embodiment, each of the contacting members 380 is a threaded bolt 381. The threaded bolt 381 is fastened in a tapped hole 331 of one of the elastic cantilevers 330, and extends towards the bottom plate 200 so that an end surface 382 of the threaded bolt 381 is in direct contact with the surface of the bottom plate 200.

Figure 6:
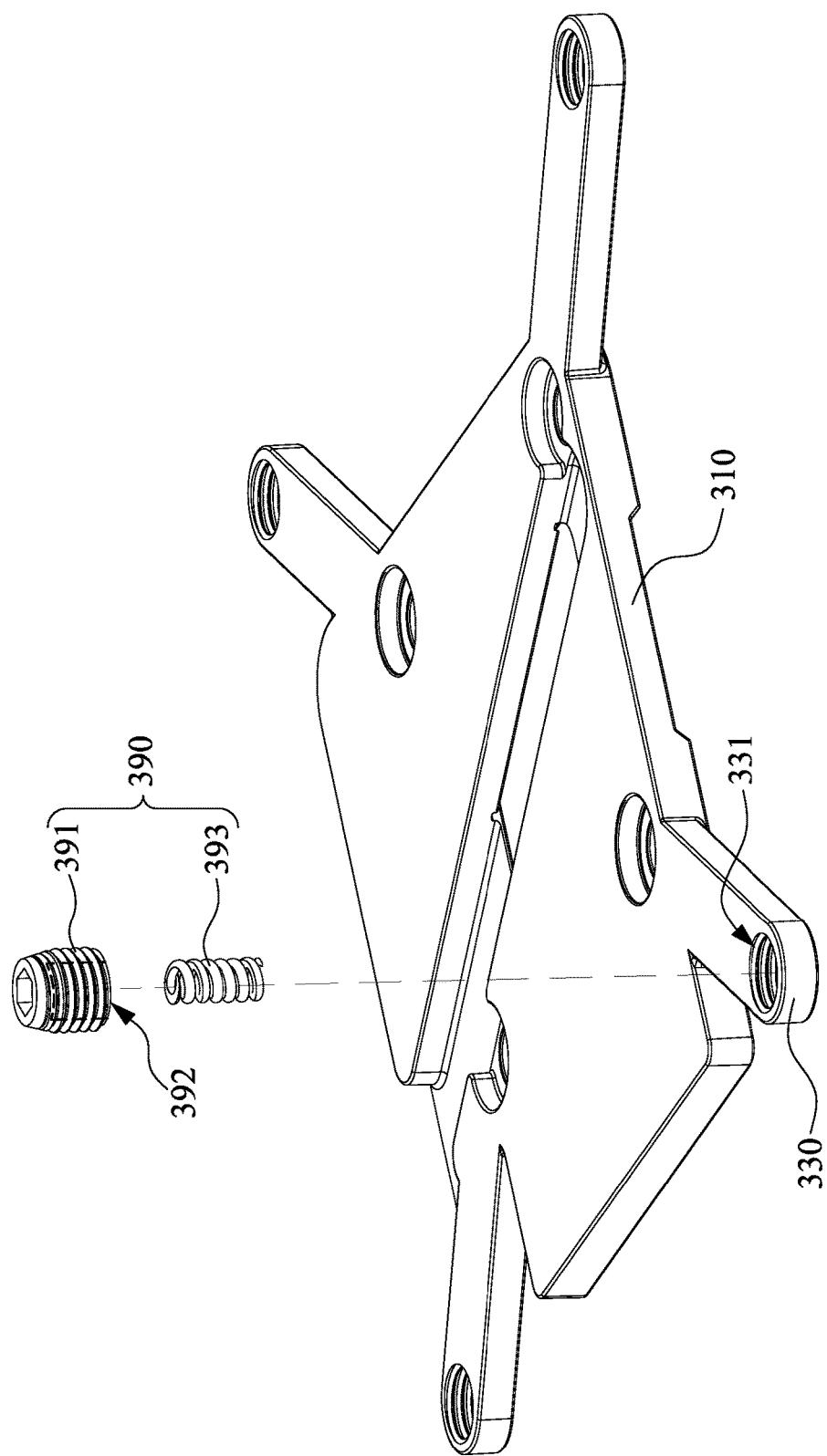
FIG. 6 is a disassembled view of a contacting member cooperated with the pressing unit according to one embodiment of the disclosure.

FIG. 6 is a disassembled view of a contacting member 390 cooperated with the pressing unit 310 according to one embodiment of the disclosure. As shown in FIG. 2 and FIG. 6, in the embodiment, each of the contacting members 390 includes a tension spring 393 and a threaded bolt 391. The threaded bolt 391 is fastened in a tapped hole 331 of one of the elastic cantilevers 330, and extends towards the bottom plate 200. A concaved portion 392 is formed on one end surface of the threaded bolt 391 facing towards the bottom plate 200. The tension spring 393 is installed in the concaved portion 392. One end of the tension spring 393 abuts the threaded bolt 391 in the concaved portion 392, the other end of the tension spring 393 is compressible and in direct contact with the surface of the bottom plate 200.

Figure 7:
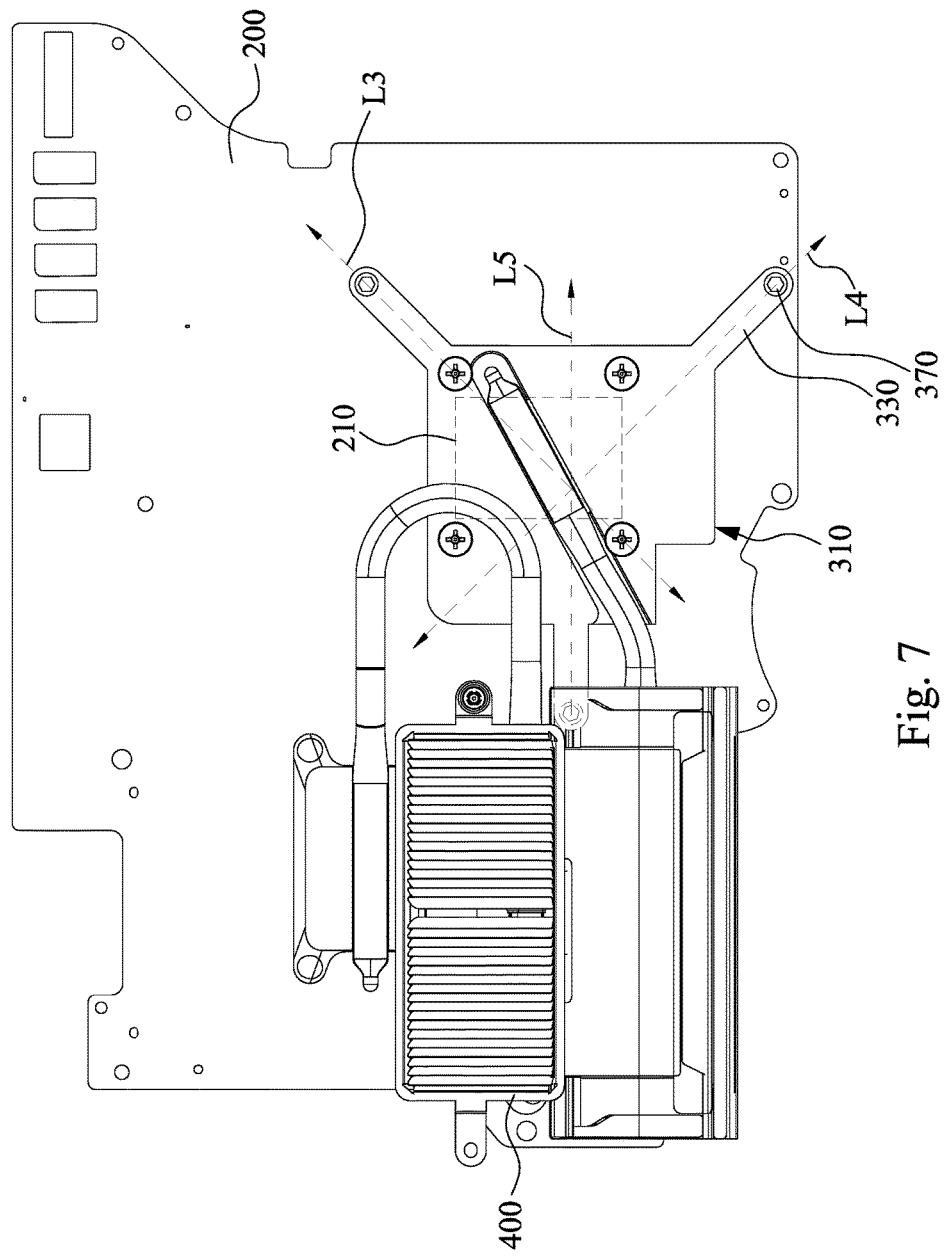
FIG. 7 is a top view of an electronic device according to one embodiment of the disclosure.

FIG. 7 is a top view of an electronic device 11 according to one embodiment of the disclosure. As shown in FIG. 7, the electronic device 11 of FIG. 7 is substantially the same to the electronic device 10 of FIG. 1, except that the elastic cantilevers 330 in the embodiment is three in number. Specifically, an orthographic projection of the intersection point of the three major axis directions L3-L5 overlaps the heat source 210. Therefore, the embodiment not only can save the manufacturing cost of the pressing unit 310, but also increase the configuration space of the bottom plate 200.

Figure 8:
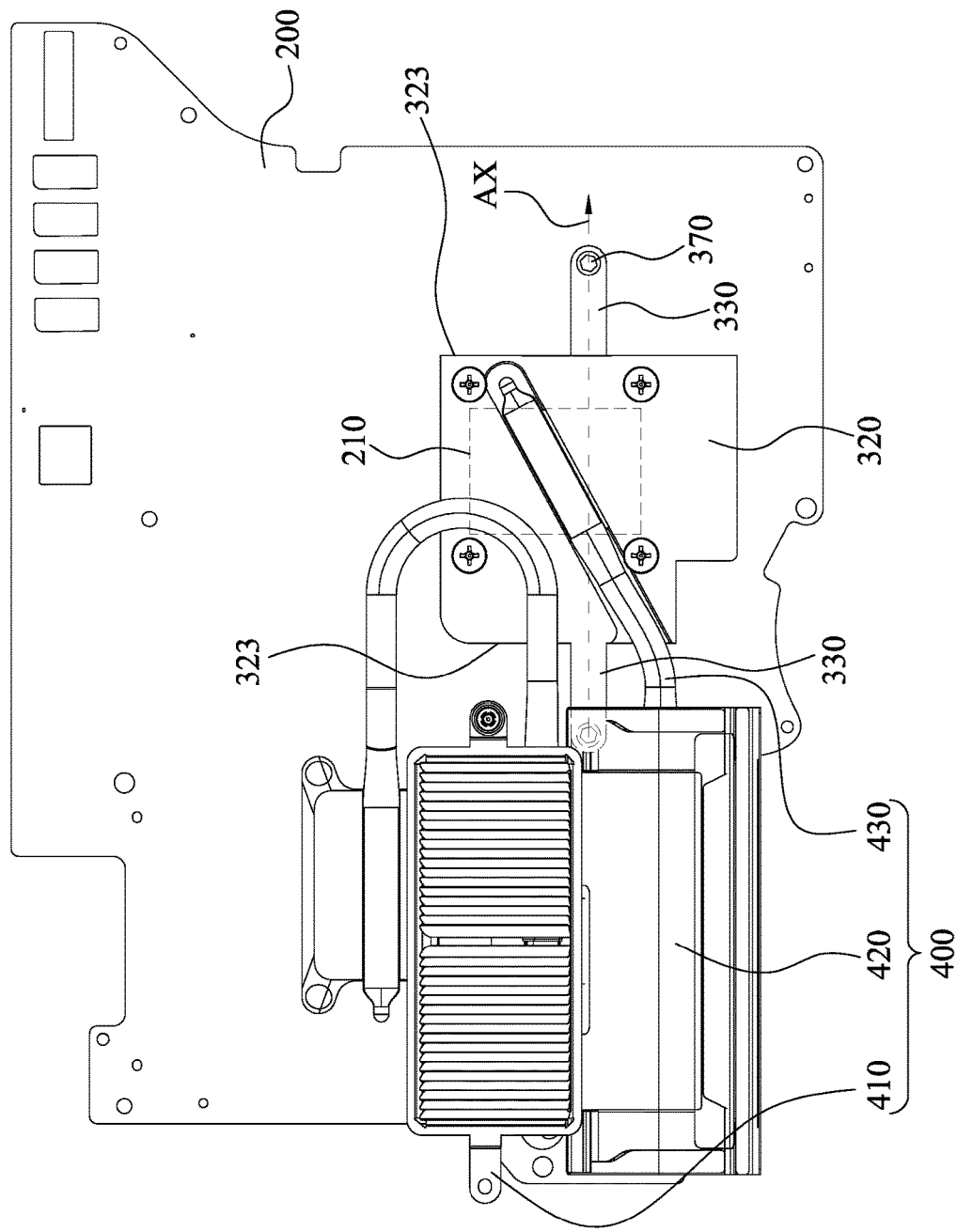
FIG. 8 is a top view of an electronic device according to one embodiment of the disclosure.

FIG. 8 is a top view of an electronic device 12 according to one embodiment of the disclosure. As shown in FIG. 8, the electronic device 12 of FIG. 8 is substantially the same to the electronic device 10 of FIG. 1, except that the elastic cantilevers 330 in the embodiment is two in number. Specifically, the two elastic cantilevers 330 are respectively connected to two opposite lateral sides 323 of the pressing plate 320, and a route of the heat pipe 430 extending to the fin assembly 420 passes through one of the two opposite lateral sides 323 of the pressing plate 320. Furthermore, the two elastic cantilevers 330 share collectively a major axel direction AX, that is, the major axel direction AX of the two elastic cantilevers 330 are coaxial, and the major axel direction AX goes across the heat source 210.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. An electronic device, comprising:
    a carrier member;
    a bottom plate;
    a heat source disposed on one surface of the bottom plate;
    a pressing unit comprising:
        a plurality of spring fasteners;
        a pressing plate secured on the surface of the bottom plate through the spring fasteners such that the heat source is sandwiched between the bottom plate and the pressing plate;
        a plurality of elastic cantilevers respectively disposed on the pressing plate and protruding outwards from the pressing plate to be suspended in midair; and
        a plurality of contacting members respectively disposed on the elastic cantilevers, and directly pressing against the surface of the bottom plate, and not bonded to the bottom plate, wherein one end of each of the contacting members has a rigid ball, wherein, each of the contacting members directly point-contacts the surface of the bottom plate through the rigid ball, each of the contacting members is in movably contact with the surface of the bottom plate with the rigid ball; and
    a heat dissipation module fixedly connected to the pressing plate and the carrier member, and thermally guiding the heat source.

2. The electronic device of claim 1, wherein each of the elastic cantilevers is provided with a major axis direction, wherein every two neighboring ones of the major axis directions are intersected with each other, and an intersection point of the two major axis directions overlaps the heat source.

3. The electronic device of claim 1, wherein each of the elastic cantilevers is provided with a major axis direction, wherein two of the major axis directions are coaxial, and extended over the heat source.

4. The electronic device of claim 1, wherein the heat dissipation module comprises:
    a heat pipe fixedly connected to the pressing plate;
    a holding rack fixedly connected to the carrier member; and
    a fin assembly received in the holding rack, and fixedly connected to the heat pipe, wherein the elastic cantilevers are respectively connected to two opposite lateral sides of the pressing plate, and a route of the heat pipe extending to the fin assembly passes through one of the two opposite lateral sides of the pressing plate.

5. The electronic device of claim 1, wherein one of the contacting members comprises:
    a pillar raised outwards from one of the elastic cantilevers, wherein the rigid ball disposed on one end of the pillar, and being in direct contact with the surface of the bottom plate; and
    a resilient member abutting against the pillar and the rigid ball.

6. The electronic device of claim 1, wherein the pressing plate is provided with a plurality of lateral sides and corners, each of the lateral sides is arranged between two neighboring ones of the corners,
    wherein one of the elastic cantilevers is connected to one of the corners; or
    one of the elastic cantilevers is connected to a position between two neighboring ones of the corners.

7. The electronic device of claim 1, wherein the pressing plate is provided with a first main surface and a second main surface which are opposite to each other, the heat dissipation module is fixedly connected to the first main surface of the pressing plate, and the second main surface is facing towards the heat source, wherein one of the elastic cantilevers is connected to the first main surface, and extends outwardly to be suspended in midair.

8. A heat dissipation assembly, comprising:
a pressing unit comprising:
a plurality of spring fasteners;
a pressing plate for being secured on a surface of a bottom plate through the spring fasteners such that a heat source is able to be sandwiched between the bottom plate and the pressing plate;
a plurality of elastic cantilevers respectively disposed on the pressing plate and protruding outwards from the pressing plate to be suspended in midair; and
a plurality of contacting members respectively disposed on the elastic cantilevers for directly pressing against the surface of the bottom plate, wherein, the contacting members are not bonded to the bottom plate, one end of each of the contacting members has a rigid ball, each of the contacting members directly point-contacts the surface of the bottom plate through the rigid ball and a surface of each of the contacting members is in movably contact with the surface of the bottom plate with the rigid ball; and
a heat dissipation module fixedly connected to the pressing plate and a carrier member for thermally guiding the heat source.

* * * * *